United States Patent
Bergendahl et al.

(10) Patent No.: US 10,217,634 B2
(45) Date of Patent: *Feb. 26, 2019

(54) FIN PATTERNS WITH VARYING SPACING WITHOUT FIN CUT

(71) Applicant: INTERNATIONAL BUSINESS MACHINES CORPORATION, Armonk, NY (US)

(72) Inventors: Marc A. Bergendahl, Troy, NY (US); Kangguo Cheng, Schenectady, NY (US); John R. Sporre, Albany, NY (US); Sean Teehan, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/908,166

(22) Filed: Feb. 28, 2018

(65) Prior Publication Data

US 2018/0190491 A1 Jul. 5, 2018

Related U.S. Application Data

(60) Continuation of application No. 15/627,685, filed on Jun. 20, 2017, which is a division of application No. 15/153,226, filed on May 12, 2016.

(51) Int. Cl.
*H01L 21/033* (2006.01)
*H01L 29/66* (2006.01)
(Continued)

(52) U.S. Cl.
CPC ...... *H01L 21/0337* (2013.01); *H01L 21/3086* (2013.01); *H01L 29/6653* (2013.01);
(Continued)

(58) Field of Classification Search
CPC ......... H01L 29/66803; H01L 29/66795; H01L 29/7855; H01L 29/785; H01L 21/0332;
(Continued)

(56) References Cited

U.S. PATENT DOCUMENTS 7,301,210 B2   11/2007  Abadeer et al.
7,763,531 B2    7/2010  Abadeer et al.
(Continued)

OTHER PUBLICATIONS

List of IBM Patents or Patent Applications Treated as Related dated Feb. 28, 2018, 2 pages.

*Primary Examiner* — Andrew Q Tran
(74) *Attorney, Agent, or Firm* — Tutunjian & Bitetto, P.C.; Vazken Alexanian

(57) ABSTRACT

Methods of forming semiconductor fins include forming first spacers on a first sidewall of each of a plurality of mandrels using a directional deposition process. A finless region is masked by forming a mask on a second sidewall of one or more of the plurality of mandrels. Second spacers are formed on a second sidewall of unmasked mandrels using a directional deposition process. The finless region is unmasked and each of the plurality of mandrels is etched away. Fins are formed from a substrate using the first and second spacers as a mask, such that no fins are formed in the finless region.

12 Claims, 5 Drawing Sheets

(51) Int. Cl.
*H01L 21/308* (2006.01)
*H01L 21/321* (2006.01)

(52) U.S. Cl.
CPC .... *H01L 29/6656* (2013.01); *H01L 29/66795* (2013.01); *H01L 21/32105* (2013.01)

(58) Field of Classification Search
CPC ............. H01L 21/0337; H01L 21/3086; H01L 21/3081; H01L 21/823431
See application file for complete search history.

(56) References Cited

U.S. PATENT DOCUMENTS

| | | |
|---|---|---|
| 8,237,136 B2 * | 8/2012 | Hautala ................. C23C 14/221 118/723 CB |
| 8,569,152 B1 | 10/2013 | Basker et al. |
| 8,603,893 B1 | 12/2013 | Wei et al. |
| 8,785,284 B1 | 7/2014 | Bergendahl et al. |
| 8,815,668 B2 | 8/2014 | Basker et al. |
| 8,815,670 B2 | 8/2014 | Basker et al. |
| 8,828,876 B2 | 9/2014 | Horak et al. |
| 9,006,110 B1 | 4/2015 | Sun et al. |
| 9,040,371 B2 | 5/2015 | Cheng et al. |
| 9,087,792 B2 | 7/2015 | Cheng et al. |
| 9,171,764 B2 | 10/2015 | Kim et al. |
| 9,177,820 B2 | 11/2015 | Bergendahl et al. |
| 9,263,290 B2 | 2/2016 | Bergendahl et al. |
| 9,269,627 B1 | 2/2016 | Cheng et al. |
| 9,685,440 B1 * | 6/2017 | Cheng ................. H01L 27/0886 |
| 9,984,877 B2 * | 5/2018 | Bergendahl ......... H01L 21/3086 |
| 2011/0111596 A1 | 5/2011 | Kanakasabapathy |
| 2015/0170927 A1 | 6/2015 | Cheng et al. |

\* cited by examiner

FIN PATTERNS WITH VARYING SPACING WITHOUT FIN CUT

BACKGROUND

Technical Field

The present invention generally relates to semiconductor device fabrication and, more particularly, to forming semiconductor fins using a directional sidewall deposition process and sidewall image transfer.

Description of the Related Art

Sidewall image transfer (SIT) is used in the fabrication of, e.g., fin field effect transistors (FinFETs) to create semiconductor fins that have a feature size that is smaller than the smallest available feature size in a lithographic process. SIT forms sidewalls on a mandrel and then removes the mandrel. The sidewalls are used as a mask for a subsequent etch that defines the semiconductor fins. However, this process creates pairs of fins—one on each sidewall of the mandrel. If a given fin is not part of the design, it is removed after formation by using a fin cut mask.

As fin pitch shrinks, fins are formed closer to one another. The inherent variations of misalignment of mask deposition produce a yield problem for close fin pitches, resulting in either incomplete removal of unneeded fins (when the fin cut mask fails to cover the unneeded fins) or an unintentional cut of device fins (when the fin cut mask encroaches onto the device fins).

SUMMARY

A method of forming semiconductor fins includes forming first spacers on a first sidewall of each of a plurality of mandrels using a directional deposition process. A finless region is masked by forming a mask on a second sidewall of one or more of the plurality of mandrels. Second spacers are formed on a second sidewall of unmasked mandrels using a directional deposition process. The finless region is unmasked and each of the plurality of mandrels is etched away. Fins are formed from a substrate using the first and second spacers as a mask, such that no fins are formed in the finless region.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention employ a directional sidewall deposition process to form sidewalls on only one side of a mandrel. For regions where no fin is needed, the mandrels are then masked while a second directional sidewall deposition process is used. In this manner, sidewalls are created only on those sides of the mandrels that correspond to device fins. No fin cut is then needed, as no extraneous fins are created.

Figure 1:
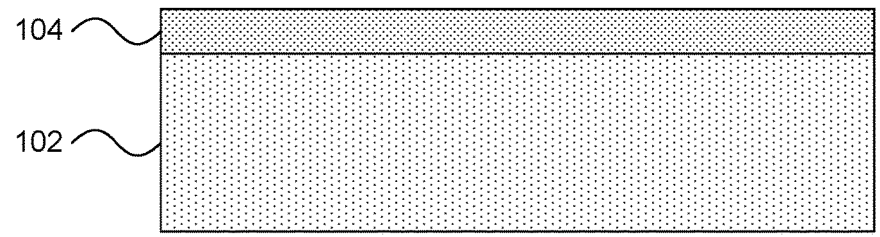
FIG. 1 is a cross-sectional diagram of a step in forming fins in accordance with the present principles.

Referring now to FIG. 1, a cross-sectional view of a step in forming a semiconductor device is shown. A pad layer 104 is formed on a semiconductor substrate 102. It is specifically contemplated that the pad layer 104 may be formed from a nitride, such as silicon nitride, but it should be understood that any appropriate material may be used instead. In addition, although the present embodiments are directed to the formation of semiconductor fins for the purpose of forming, e.g., fin field effect transistors (FinFETs), the material of the substrate 102 dictates the material of the fins that will be formed, and any appropriate material may be used to create fins for any purpose.

In one embodiment, the semiconductor substrate 102 is formed from a bulk, silicon-containing material. Illustrative examples of silicon-containing materials suitable for the bulk-semiconductor substrate include, but are not limited to, silicon, silicon germanium, silicon carbide, silicon germanium carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted herein, the semiconductor substrate 102 may also be a semiconductor on insulator (SOI) substrate.

Figure 2:
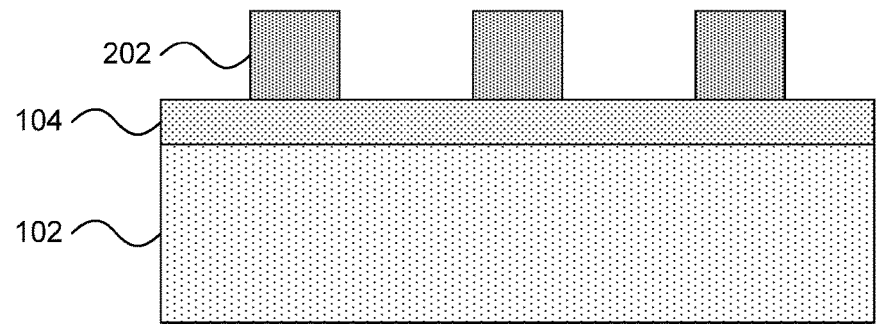
FIG. 2 is a cross-sectional diagram of a step in forming fins in accordance with the present principles.

Referring now to FIG. 2, a cross-sectional view of a step in forming a semiconductor device is shown. A set of mandrels 202 are deposited on the pad layer 104. It is specifically contemplated that the mandrels 202 may be formed from amorphous silicon, but any appropriate material may be used instead. The mandrels 202 may formed using any appropriate lithographic process.

In one embodiment of a lithographic process, a hard mask may be used to define the mandrels 202. The hardmask may be formed by first depositing a dielectric hard mask material, such as silicon nitride or silicon dioxide, atop a layer of mandrel material and then applying a photoresist pattern to the hard mask material by depositing a photoresist material and illuminating regions of the photoresist material with an appropriate light source. The illuminated regions of the photoresist material create a photoresist pattern that defines regions for the mandrels 202. The photoresist pattern is then transferred into the hard mask material using, for example, a dry etch process. Next the photoresist pattern is removed and the hard mask pattern is then transferred into the mandrel material during a selective etching process. The hard mask may be removed by a wet or dry etch, leaving only the mandrels 202.

Figure 3:
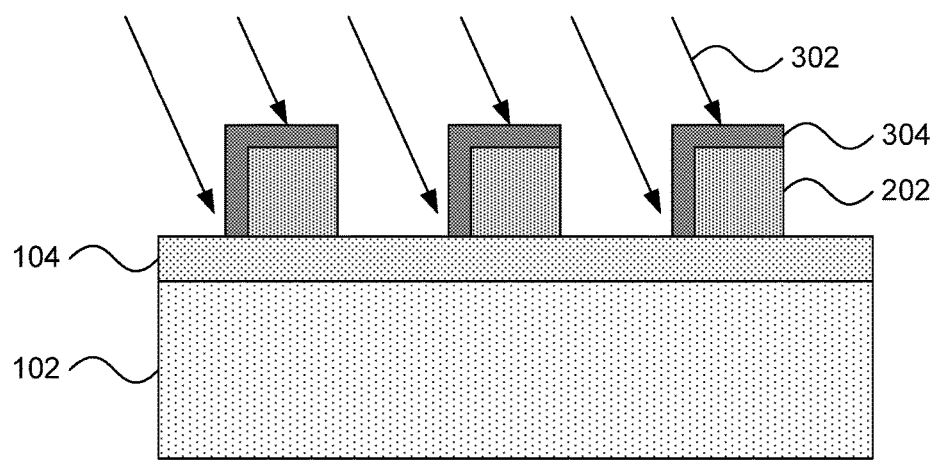
FIG. 3 is a cross-sectional diagram of a step in forming fins in accordance with the present principles.

Referring now to FIG. 3, a cross-sectional view of a step in forming a semiconductor device is shown. An angled, directional deposition process is used to deposit spacers 304 on the top and on one lateral side of each mandrel 202. As shown, the angled, directional deposition process meets the mandrels 202 at an angle, such that material on the lee side of each mandrel 202 impacts the next mandrel 202 or accumulates on the pad layer 104.

It should be understood that any form of directional deposition may be used to deposit the spacers 304, but gas cluster ion beam (GCIB) deposition is specifically contemplated. In GCIB deposition, a high-pressure gas is allowed to expand in a vacuum and subsequently condense into clusters. The clusters can be ionized and directed onto a surface using magnets to provide a highly anisotropic deposition. The angle of this gas cluster ion beam can be controlled to provide any appropriate deposition angle. Exemplary materials that may be used in GCIB deposition include silane, ammonia, nitrogen, argon, oxygen, nitrogen trifluoride, tetrafluoromethane, diborane, phosphine, arsine, germane, methane, and others. The GCIB bombardment can penetrate a surface from about 2 nm to about 20 nm, implanting the GCIB species to such a depth where it may interact with the material of the surface.

It is specifically contemplated that the GCIB deposition process may use oxygen to oxidize the affected surfaces of the mandrels 202. The GCIB process may alternatively use precursor gasses that include oxygen including, e.g., carbon monoxide or carbon dioxide. These oxygen-containing precursors can additionally be combined with other mixture gasses such as nitrogen, helium, or similar, to vary cluster size and/or material conversion rate, or to create co-infused films, (e.g., oxygen/nitrogen gas mixtures to create silicon oxynitride). In a process using a pure oxygen beam, the mixture flow rate can be between about 200 sccm and about 1,000 sccm through an expansion nozzle to create an atomic cluster having between about 100 and about 1000 atoms/ cluster. The acceleration voltage of these clusters will range between about 1 kV to 80 kV, depending on the amount of material conversion depth needed, resulting in an oxygen dose of $\sim 1 \times 10^{12}$ ions/cm$^2$ to about $1 \times 10^{16}$ ions/cm$^2$. A pressure cell having a voltage ranging between about 1V to about 60 kV can then be applied to these clusters directly before wafer impact to break up clusters and reduce any sub-layer damage.

If the mandrels 202 are formed from amorphous silicon, then the spacers 304 that result from a pure oxygen beam are formed from silicon dioxide. In an alternative embodiment, the GCIB deposition may be used to directly deposit spacer material onto the surface of the mandrels 202 to form the spacers 304. It is specifically contemplated that spacers 304 may be formed to a thickness of about 10 nm, but it should be understood that any appropriate thickness may be formed in accordance with design needs.

The angle of GCIB bombardment can be between about 10° and about 80°, depending on the height and spacing of the mandrels 202, with taller mandrels necessitating the use of steeper angles. The angle of bombardment can be set using electrostatic lenses and/or wafer staging—physically angling the wafer underneath an otherwise vertical beam to achieve a specific angle.

Figure 4:
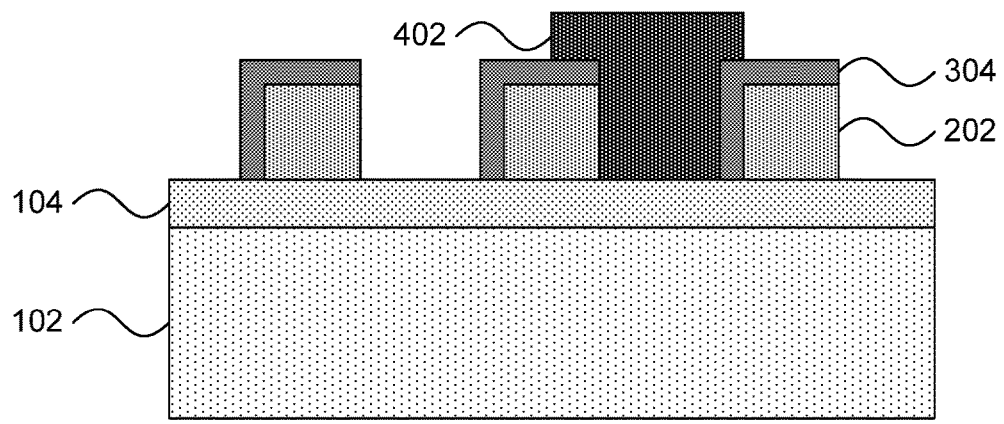
FIG. 4 is a cross-sectional diagram of a step in forming fins in accordance with the present principles.

Referring now to FIG. 4, a cross-sectional view of a step in forming a semiconductor device is shown. A mask 402 is deposited over one or more of the uncovered mandrel sidewalls in regions where fins are not needed. It should be noted that the deposition of the mask 402 has a large margin of error with respect to lithography process variations. As shown in FIG. 4, the mask 402 is unintentionally formed such that the mask 402 runs over onto the next mandrel 202. Because the spacers 304 already exist on the next mandrel 202, the presence of the mask 402 does not affect whether fins will be formed in that region. The mask 402 may therefore be made significantly smaller or larger without affecting the outcome.

Figure 5:
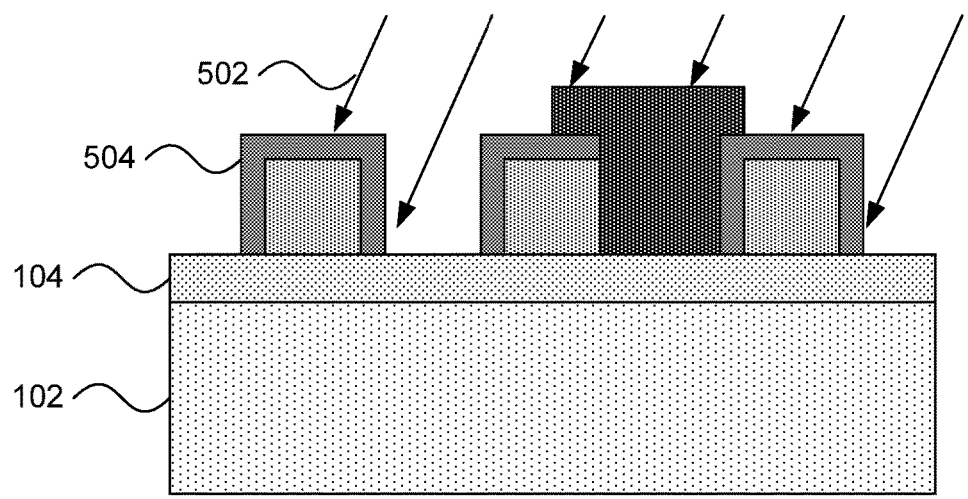
FIG. 5 is a cross-sectional diagram of a step in forming fins in accordance with the present principles.

Referring now to FIG. 5, a cross-sectional view of a step in forming a semiconductor device is shown. The directional, angled deposition process is repeated, this time aimed in a direction that reaches the previously unexposed surfaces of the mandrels 202. For those surfaces, the spacer is extended to form spacer 504 that covers the entire mandrel 202. However, for sidewalls that are covered by the mask 402, the deposited species 502 cannot reach the sidewalls and no spacer is formed. As noted above, the directional, angled deposition process may include GCIB deposition. In an alternative embodiment, an isotropic deposition process may be used for the second spacer formation step—because the mask 402 is in place, the isotropic etch will be unable to reach the second mandrel sidewall.

Figure 6:
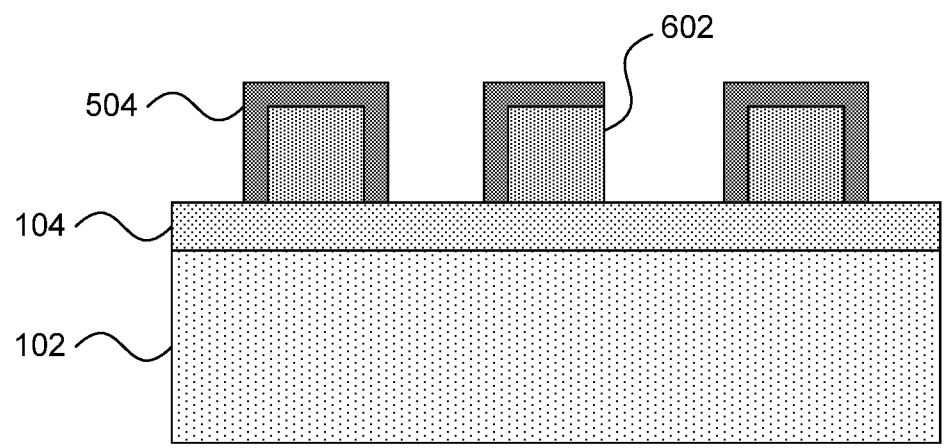
FIG. 6 is a cross-sectional diagram of a step in forming fins in accordance with the present principles.

Referring now to FIG. 6, a cross-sectional view of a step in forming a semiconductor device is shown. The mask 402 is removed by any appropriate etching process, such as a wet etch or a dry etch. The removal of the mask 402 exposes un-oxidized sidewall(s) 602, which lack spacer material. In contrast, other mandrels 202 are fully encapsulated by spacer 504.

Figure 7:
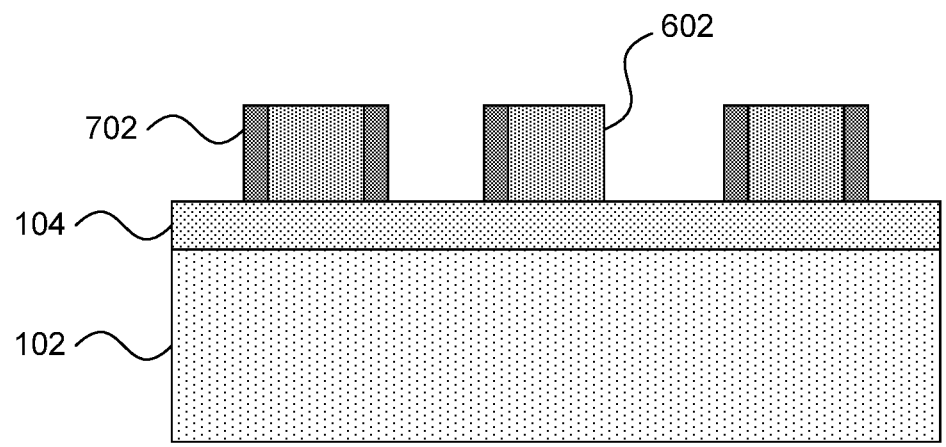
FIG. 7 is a cross-sectional diagram of a step in forming fins in accordance with the present principles.

Referring now to FIG. 7, a cross-sectional view of a step in forming a semiconductor device is shown. An anisotropic etch, such as reactive ion etching (RIE), is used to remove spacer material from the horizontal surfaces of the mandrels 202. This leaves spacers 702 on the sidewalls of the mandrels 202, with a gap on sidewall 602 where no spacer is formed.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 8:
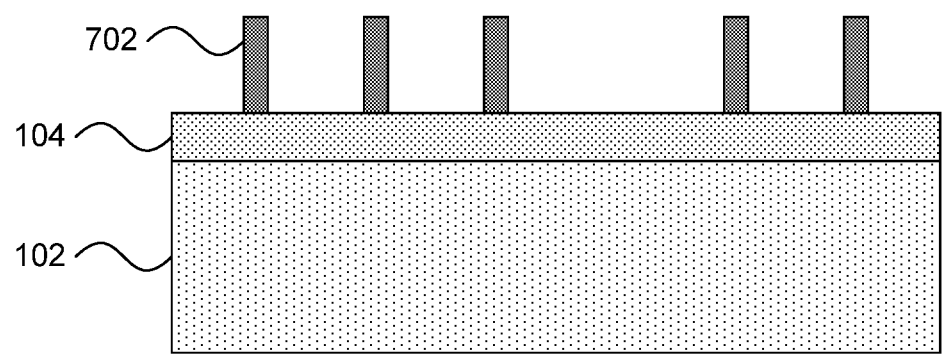
FIG. 8 is a cross-sectional diagram of a step in forming fins in accordance with the present principles.

Referring now to FIG. 8, a cross-sectional view of a step in forming a semiconductor device is shown. The mandrels 202 have been removed using any appropriate etch (e.g., a wet chemical etch), leaving the spacers 702 standing. As can be seen in the figure, the spacers 702 in this example are evenly spaced, with the exception of a gap where the mask 402 prevented spacers from being formed in the second angled, directional deposition.

Figure 9:
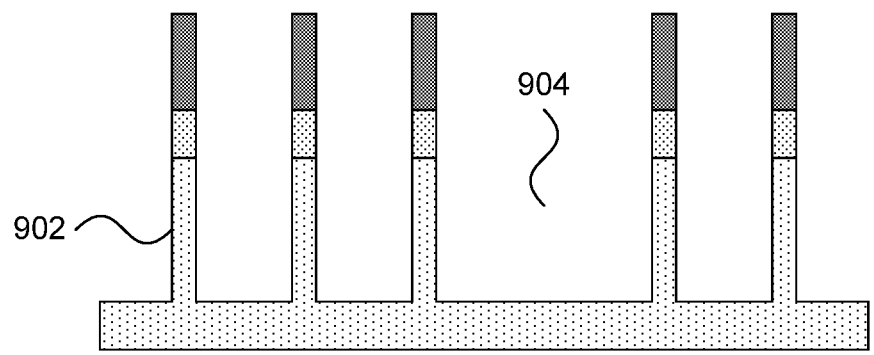
FIG. 9 is a cross-sectional diagram of a step in forming fins in accordance with the present principles.

Referring now to FIG. 9, a cross-sectional view of a step in forming a semiconductor device is shown. The spacers 702 are used as a mask for an anisotropic etch that forms semiconductor fins 902 from the semiconductor substrate 102. The spacing between the fins 902 is therefore the same as the spacing between their respective spacers 702, with a gap 904 being left where no fin was formed. In this manner, fins 902 can be formed at any appropriate spacing without the need to remove extraneous fins after formation, thereby preventing, for example, accidental removal of device fins.

Once the semiconductor fins 902 have been formed, a semiconductor device may be finished by, for example, forming a gate stack over a channel region of a fin and forming source and drain regions at respective ends of the fin. This results in a fin field effect transistor (FinFET), with many variations on the general FinFET design being available. For example, the source/drain regions of adjacent fins may be merged, different gate configurations are available, and other structural modifications may be made to the fins in accordance with device design.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 10:
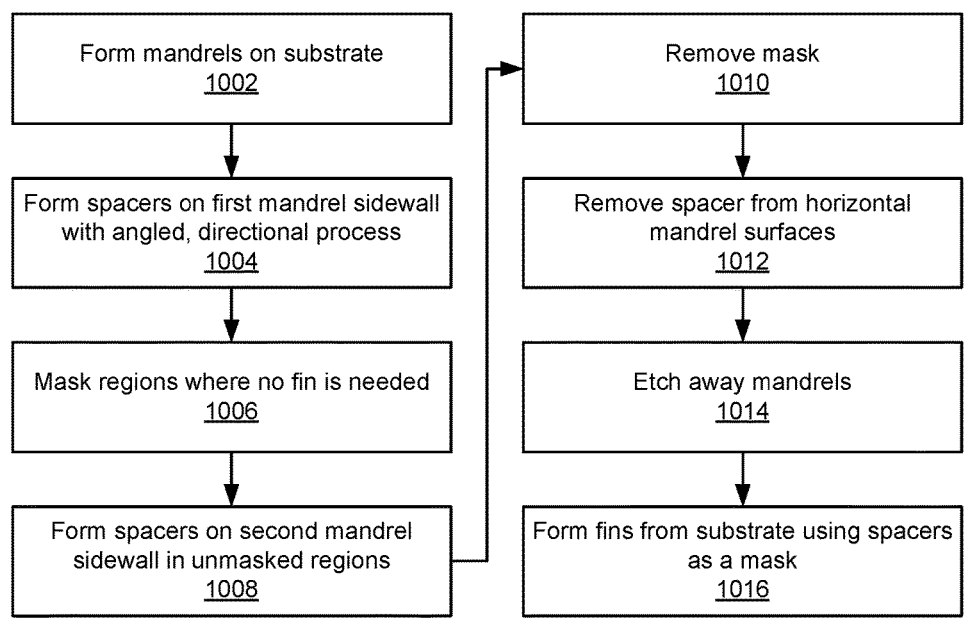
FIG. 10 is a block/flow diagram of a method of forming fins in accordance with the present principles.

Referring now to FIG. 10, a method for forming fins is shown. Block 1002 forms the mandrels 202 on a substrate. The mandrels may be formed from, e.g., amorphous silicon using a photolithographic process. Block 1004 forms spacers 302 on a first mandrel sidewall using an angled, directional process such as GCIB, where for example the side of the mandrels 202 exposed to the GCIB process is oxidized by a beam of oxygen to form silicon dioxide.

Block 1006 masks the second sidewall of the mandrels 202 in regions where no device fins are needed. This mask 402 may be formed using any appropriate process and may touch a neighboring mandrel's spacer 302. Block 1008 forms spacers on the second mandrel sidewall, but only in the unmasked regions. In masked regions, the mask 402 blocks the angled deposition from reaching the second sidewall. Block 1010 removes the mask after the spacers 504 have been formed on unmasked mandrels 202. The previously masked mandrels have an exposed face 602.

Block 1012 removes the spacer material from horizontal mandrel surfaces using, e.g., an anisotropic etch such as RIE. This etch leaves the spacers 702 along the vertical sidewalls of the mandrels 202. Block 1014 then etches away the mandrels 202, such that the spacers 702 stand free. Block 1016 forms fins 902 from the substrate 102 using the spacers 702 as a mask, performing a timed anisotropic etch to create fins 902 at the height needed. Further processes may then be employed to form finished semiconductor devices from the fins 902.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming semiconductor fins, comprising:
   forming first spacers on a first sidewall of each of a plurality of mandrels using a first directional deposition;

masking a finless region by forming a first mask on a second sidewall of one or more of the plurality of mandrels;

forming second spacers on a second sidewall of unmasked mandrels using a second directional deposition;

unmasking the finless region;

etching away each of the plurality of mandrels; and forming said semiconductor fins from a substrate using the first and second spacers as a second mask, such that no fins are formed in the finless region.

2. The method of claim 1, wherein no fin is removed after formation of the fins.

3. The method of claim 1, wherein masking the finless region further comprises aiming the first mask to directly contact a first spacer on an adjacent mandrel.

4. The method of claim 1, wherein the substrate comprises a nitride pad layer that is directly on a semiconductor layer.

5. The method of claim 4, wherein the nitride pad layer includes silicon nitride.

6. The method of claim 1, wherein the first directional deposition includes an angled deposition process.

7. The method of claim 1, wherein unmasking the finless region includes unmasking the second sidewall of the one or more of the plurality of mandrels.

8. The method of claim 1, further comprising patterning a mandrel material using a hard mask to form the plurality of mandrels prior to forming the first spacers.

9. The method of claim 1, wherein the first spacers on the first sidewall include silicon dioxide.

10. The method of claim 1, wherein forming the second spacers encapsulates all the unmasked mandrels in spacer material from the first and second spacers.

11. The method of claim 1, wherein the first and second directional depositions each use an oxygen gas cluster ion beam.

12. The method of claim 11, wherein the oxygen gas cluster ion beam has an angle relative to the substrate between about 10° and about 80°.

* * * * *